United States Patent [19]
Ota et al.

[11] Patent Number: 5,477,309
[45] Date of Patent: Dec. 19, 1995

[54] ALIGNMENT APPARATUS

[75] Inventors: Kazuya Ota, Tokyo; Hiroki Okamoto, Kawasaki, both of Japan

[73] Assignee: Nikon Corporation, Tokyo, Japan

[21] Appl. No.: 369,582

[22] Filed: Jan. 6, 1995

Related U.S. Application Data

[63] Continuation of Ser. No. 187,493, Jan. 28, 1994, abandoned, which is a continuation-in-part of Ser. No. 26,575, Mar. 5, 1993, abandoned.

[30] Foreign Application Priority Data

| Mar. 9, 1992 | [JP] | Japan | 4-085916 |
| Oct. 22, 1992 | [JP] | Japan | 4-284370 |
| Jan. 28, 1993 | [JP] | Japan | 5-012188 |

[51] Int. Cl.⁶ .................................................... G01B 11/00
[52] U.S. Cl. ........................ 355/67; 355/53; 355/68; 356/401
[58] Field of Search ........................ 355/53, 67, 68; 356/399, 400, 401

[56] References Cited

U.S. PATENT DOCUMENTS

| 4,962,318 | 10/1990 | Nishi | 250/548 |
| 5,151,750 | 9/1992 | Magome et al. | 356/401 |

*Primary Examiner*—Michael L. Gellner
*Assistant Examiner*—Daniel P. Malley
*Attorney, Agent, or Firm*—Shapiro and Shapiro

[57] ABSTRACT

In an alignment apparatus for irradiating detection laser beams LB1 and LB2 to an alignment mark and detecting a position of a wafer 1 by using a light produced from the alignment mark, a width d of a recess 2b of the alignment mark along an alignment direction is set to be smaller than a length $(\lambda+c)$ which is larger than a wavelength A of the laser beams LB1 and LB2 by a predetermined amount c, to thereby provide an alignment apparatus in which it is hard to create a detection error even if the alignment mark is asymmetric.

11 Claims, 9 Drawing Sheets

ALIGNMENT APPARATUS

This is a continuation of application Ser. No. 08/187,493 filed Jan. 28, 1994, which is a continuation-in-part of the application Ser. No. 08/026,575 filed Mar. 5, 1993, both abandoned.

BACKGROUND OF THE INVENTION

1. Field of the Invention

The present invention relates to an alignment apparatus, and more particularly to an alignment apparatus suitable for use in an alignment system of a projection type exposure apparatus used in manufacturing a semiconductor device, a liquid crystal display device or a thin film magnetic head.

2. Related Background Art

When a semiconductor device, a liquid crystal display device or a thin film magnetic head is to be manufactured by using photolithography technique, a projection type exposure apparatus transfers an image of a pattern of a photomask or a reticle (hereinafter collectively referred to as reticle) onto a photo-sensitive substrate through a projection optical system. Since the semiconductor device usually comprises a number of layer patterns, it is necessary in manufacturing it to transfer various reticle patterns onto the photosensitive substrate in a predetermined sequence. When a reticle circuit pattern is to be transferred onto the photosensitive substrate in which patterns have already been transferred to shot areas, it is necessary to precisely align the reticle pattern to be exposed to the respective shot areas of the photo-sensitive substrate.

A method of precise alignment is disclosed in U.S. Pat. No. 4,710,026 which is a two-beam interference system using two laser beams.

Figure 6:
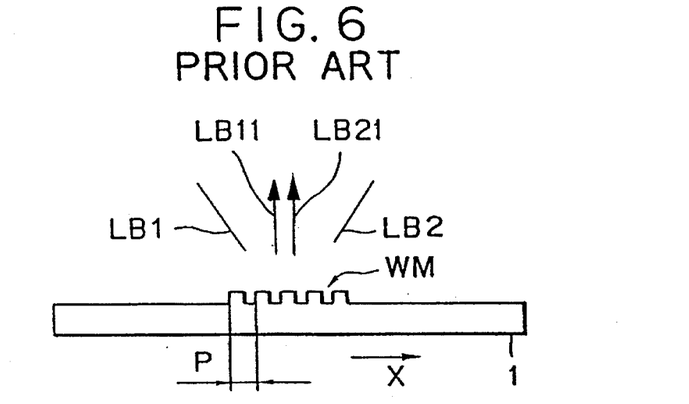
FIG. 6 illustrates a two-beam interference alignment method.

As shown in FIG. 6, in the two-beam interference system, a wafer mark WM which serves as an alignment mark having a phase type diffraction grating is formed in the vicinity of each shot area on a wafer 1 which serves as a photo-sensitive substrate. The wafer marks WM are formed at a pitch P along an X direction which is a position measurement direction. Two laser beams LB1 and LB2 are symmetrically irradiated to the wafer marks WM thorugh a projection optical system. The pitch P and incident angles of the laser beams LB1 and LB2 are selected such that a +1-order diffraction light LB11 from the wafer mark WM by the laser beam LB1 and a −1-order diffraction light LB21 from the wafer mark WM by the laser beam LB2 are parallel to each other and they are reflected normally to the wafer 1.

When the diffraction lights LB11 and LB21 are interfered by the alignment optical system through the projection optical system, a signal due to interference is produced. In a heterodyne system in which frequencies of the laser beams LB1 and LB2 are different, the signal due to the interference is one having a predetermined beat frequency, and the position of the wafer 1 along the X direction can be exactly detected by comparing a phase of that signal and a phase of a reference signal. Similarly, wafer marks are also formed along a Y direction which is orthogonal to the X direction, and the position along the Y direction is detected from those wafer marks. Reticle marks which serve as alignment marks and have amplitude type diffraction gratings are formed on the reticle and the position of the reticle is detected from those reticle marks. The alignment is attained by directly or indirectly setting the wafer marks and the reticle marks in a predetermined positional relationship.

Figure 7A:
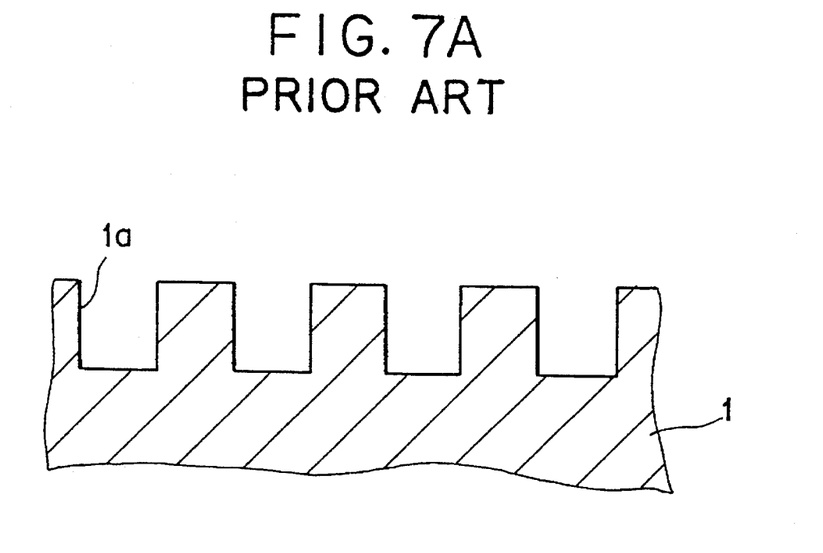
FIGS. 7A and 7B show enlarged sectional views of a prior art manufacturing process of a wafer mark.
Figure 7B:
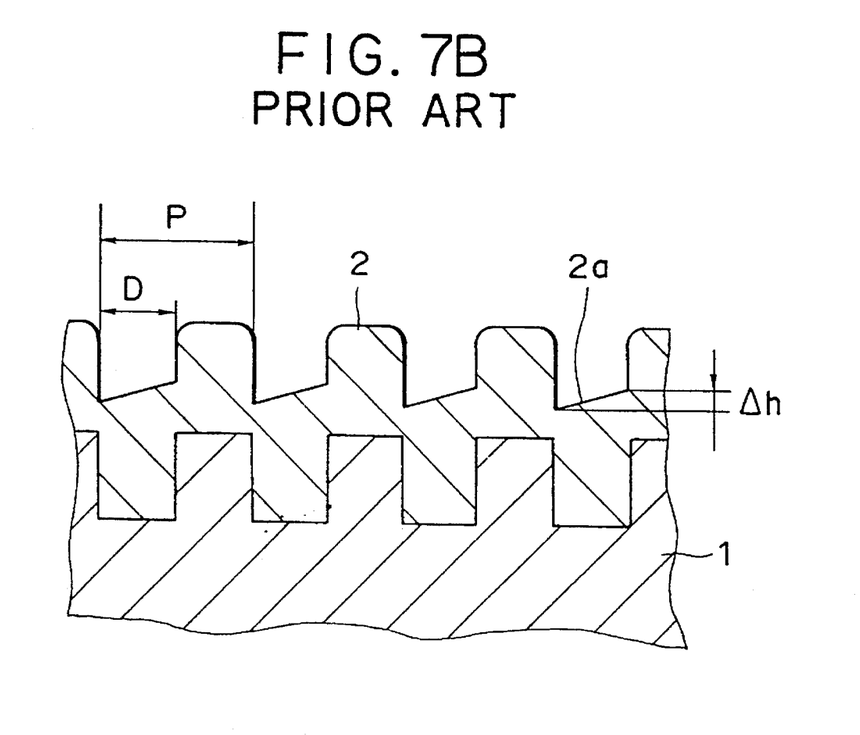

FIGS. 7A and 7B show a prior art manufacturing process of a wafer mark WM which serves as an alignment mark. As shown in FIG. 7A, periodic recesses 1a are formed by etching on a surface of the wafer 1 along the X direction at a pitch P. Then, as shown in FIG. 7B, a metal film 2 is deposited by a sputtering method on the surface including the recesses 1a. Since the portions of the metal film 2 which corresponds to the recesses 1a are formed as recesses 2a, a phase type diffraction grating having a high reflection factor and a pitch P is formed. The pitch P is 6 μm, for example, and a width D of the recess 2a of the metal film 2 along the pitch direction (measurement direction) is set in accordance with D/P=½, in the prior art.

However, as shown in FIG. 7B, in the prior art wafer mark WM, a step Δh is produced at the bottom of the recess 2a of the metal film 2 by the use of the sputtering apparatus, and the recess 2a is laterally asymmetric. When two laser beams are irradiated to such asymmetric wafer mark WM to detect the position, a detection error is included, because in the alignment by the two-beam interference system, only a specific period component of the wafer marks WM which serve as the alignment marks is extracted to determine a position of center of gravity and hence the detection error is included if asymmetric wafer marks WM are included.

Conventionally, the laser beams LB1 and LB2 irradiated to the wafer marks WM are both polarized in a circularly polarized state.

Figure 8:
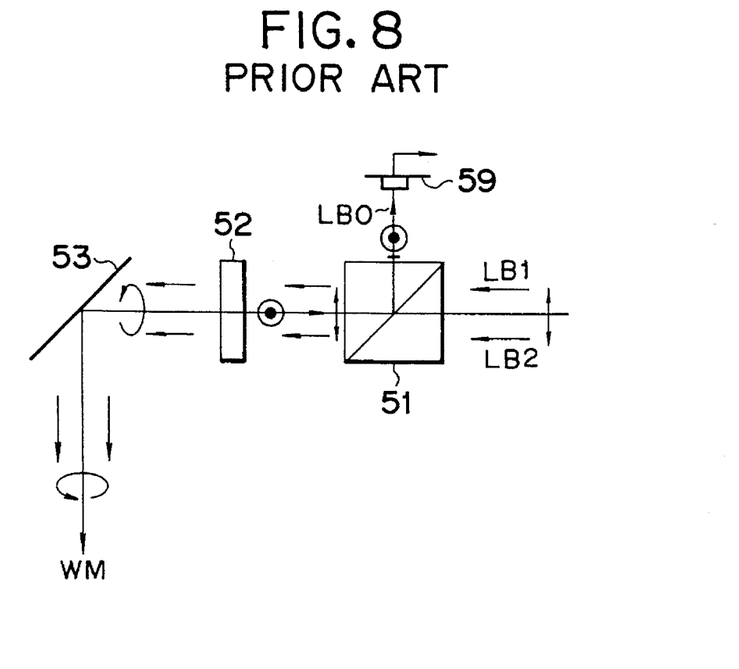
FIG. 8 shows a configuration a part of a conventional alignment optical system.

FIG. 8 illustrates a conventional optical system (isolator) for use in separating the laser beam directed to the wafer marks from the laser beam reflected from the wafer marks. Directed to a polarized beam splitter 51 are two laser beams LB1 and LB2 emitted from a combination prism that is not illustrated. The polarization of the incident laser beams LB1 and LB2 directed to the polarized beam splitter 51 is linear polarization in a direction parallel to the paper surface in FIG. 8, namely, the linear polarization of P-polarized light relative to a composition plane of the polarized beam splitter 51. Accordingly, the intact laser beams LB1 and LB2 transmit through the composition plane of the polarized beam splitter 51.

The P-polarized laser beams LB1 and LB2 transmitted through the polarized beam splitter 51 are circularly polarized by being transmitted through a quarter wavelength plate 52. They are reflected from a mirror 53 and irradiated to the wafer mark WM through, for example, a projection optical system. In this event, diffracted light beams (diffracted light beams LB11 and LB12 in FIG. 6) diffracted normally and upwardly from the wafer marks WM are circularly polarized in an inverse direction. The diffracted light beams that are circularly polarized in the inverse direction are directed to the quarter wavelength plate 52 through the projection optical system and the mirror 53. As a result, the so returned diffracted light is converted into S-polarized light on being transmitting through the quarter wavelength plate 52. The S-polarized diffracted light is totally reflected from the composition plane of the polarized beam splitter 51 and is directed to a photo-sensing device 59. In this conventional art, the loss of the amount of light is minimized with a combination of the polarized beam splitter 51 and the quarter wavelength plate 52.

SUMMARY OF THE INVENTION

It is an object of the present invention to provide an alignment apparatus in which it is hard to produce a detection error even if alignment marks are asymmetric.

Figure 1:
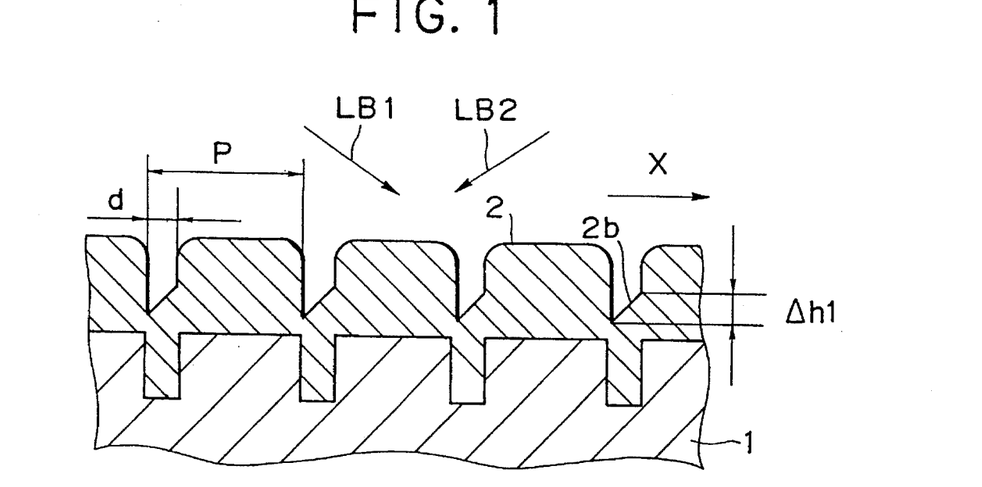
FIG. 1 shows an enlarged sectional view of a wafer mark in a first embodiment of an alignment apparatus of the present invention.
Figure 4:
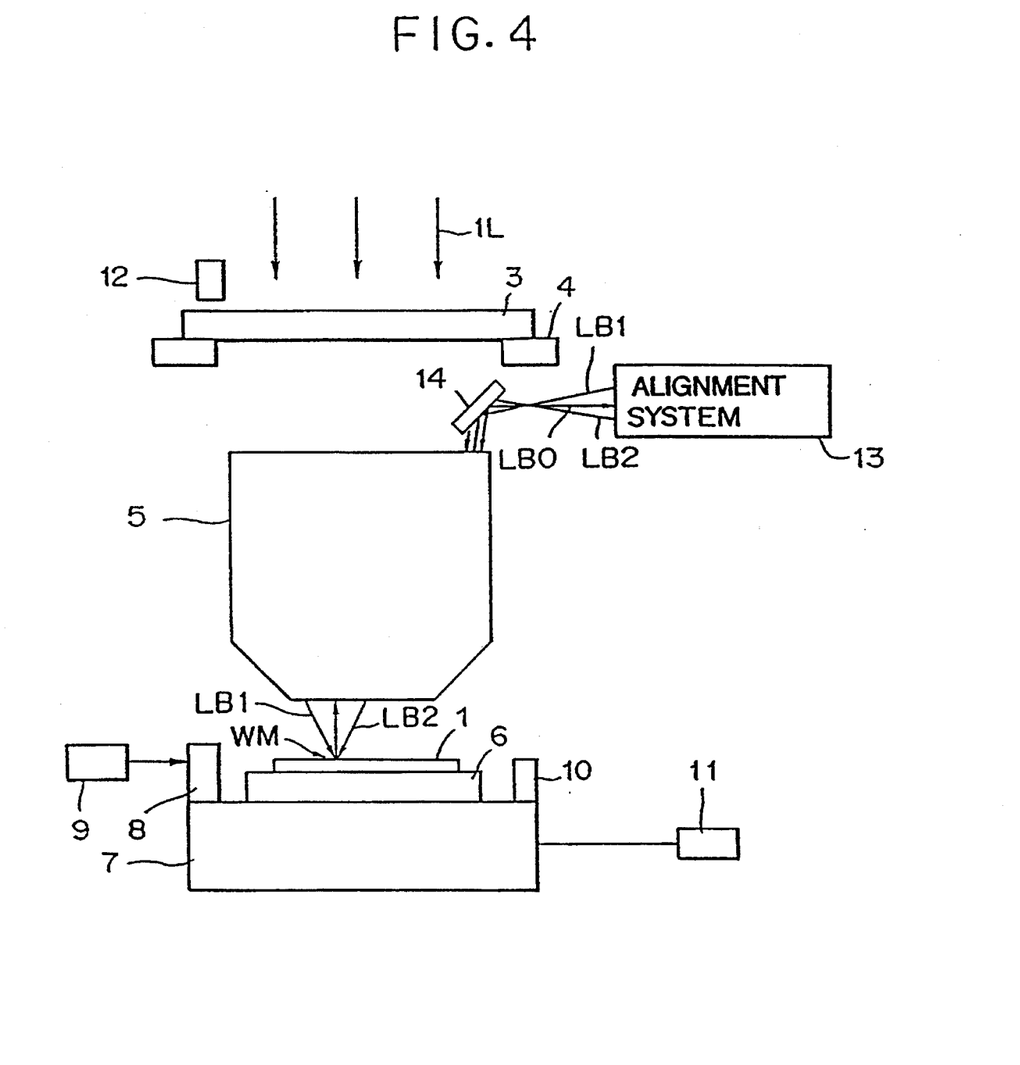
FIG. 4 shows a configuration of major portions of a projection type exposure apparatus used in the embodiments.

The alignment apparatus of the present invention comprises, as shown in FIGS. 1 and 4, alignment marks (WM) formed by recesses and projections on an article (1) under test along an alignment direction, an illumination optical system (5, 13, 14) for irradiating position detection lights (LB1, LB2) to the alignment marks (WM) and a detection optical system (5, 14, 13) for detecting a light produced from the alignment marks (WM) by the irradiation of the lights. A position of the article (1) under test is detected by using the light produced from the alignment marks (WM). A width d of the recess (2b) of the alignment mark (WM) along the alignment direction is selected to be smaller than three times of a wavelength λ of the position detection light.

Where a photo-sensitive material having a refractive index n is applied on the surface of the alignment mark (WM), the width d is selected to be smaller than 3λ/n.

Figure 2:
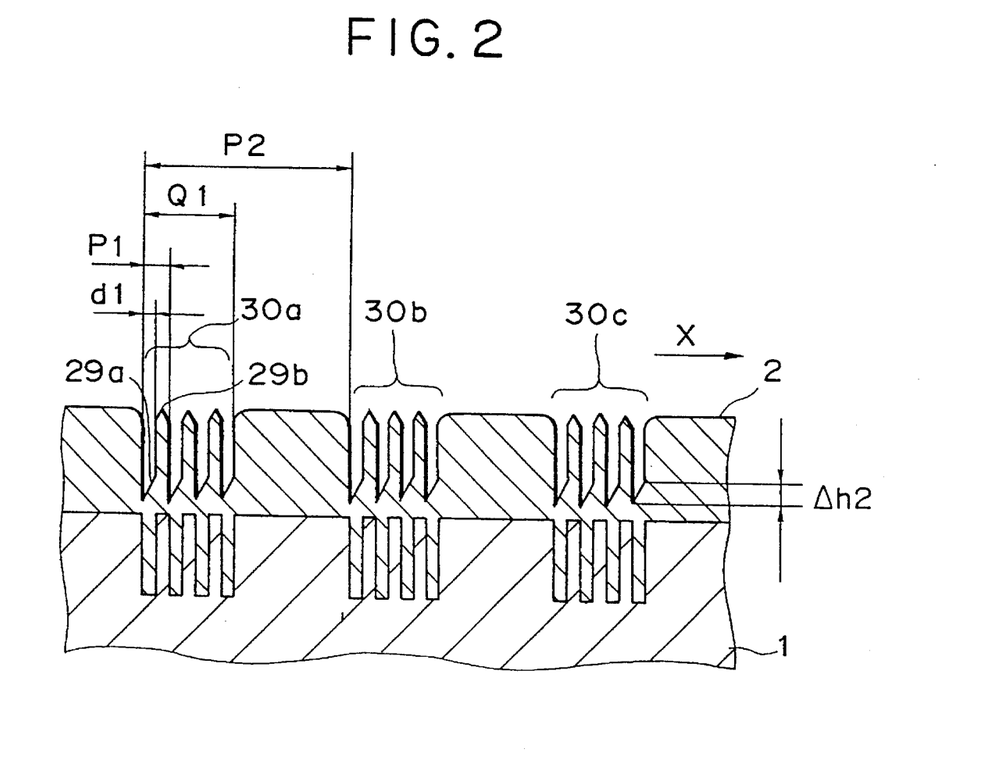
FIG. 2 shows an enlarged sectional view of a wafer mark in a second embodiment of the present invention.

As shown in FIG. 2, the alignment marks (WM) may have patterns (30a, 30b, 30c) having projections (29b) and recesses (29a) formed at a first pitch P1 along an alignment direction, which patterns repeatedly appear at a second pitch P2 which is larger than the first pitch P1 along the alignment direction. A width d1 of the recess (29a) along the alignment direction is selected to be smaller than three times of the wavelength λ of the position detection light.

The alignment marks (WM) are preferably formed on a metal film (2) deposited on the article (1) under test.

In accordance with the present invention, since the width d of the recess (2b) of the alignment mark (WM) is smaller than three times of the wavelength λ of the position detection light, the position detection light exponentially attenuates when it propagates within the recess (2b) so that it is not affected by the asymmetric bottom even if the bottom of the recess (2b) is asymmetric. Accordingly, the alignment marks (WM) are equivalent to essentially perfect marks to the position detection light, and the detection error is very much reduced.

Where the two-beam interference system is used for the detection of the alignment marks (WM), an intensity of a 1-order diffraction light from the alignment mark in the present invention may be lowered compared to a case where the prior art alignment marks having equal width of projections and recesses. However, the reduction of the intensity of the diffraction light can be compensated by enhancing the detection sensitivity of the diffraction light.

Where the alignment marks (WM) have patterns (30a, 30b, 30c) having the projections (29b) and the recesses (29a) formed at the first pitch P1 along the alignment direction, which patterns are repeatedly formed at the second pitch P2 which is larger than the first pitch P1 along the alignment direction, the position detection light is so attenuated during the propagation within each recess (29a) that it is not affected by the asymmetricity of the bottom. Further, since a ratio of an area of the recesses (29a) to an entire area of the alignment marks (WM) increases compared to the case of FIG. 1, the intensity of the detection light such as the 1-order diffraction light may be increased. Accordingly, the S/N ratio of the detection signal is improved.

Where the alignment marks (WM) are formed on the metal film (2) deposited on the article (1) under test, the effect of the asymmetricity of the bottom of the recess is reduced because the position detection light exponentially attenuates in the recess (2b or 29a) on the metal film (2).

Another object of the present invention is to provide such an alignment apparatus that reduces the affect of the asymmetricity of the bottom configuration of the recess in the alignment mark by means of rendering the polarization of the position detection light on the alignment marks (WM) into the linear polarization determined depending on the iteration direction of the alignment marks.

To detect the alignment marks formed of metal, it is preferable that a direction of electric vector of the position detection light on the alignment marks is defined orthogonal to the iteration direction of the alignment marks, i.e., parallel to the longitudinal direction of the recess (2b). As a result of this, the electrons in the recess (2b) oscillate in response to the oscillation of the vector. The position detection light exponentially attenuates when it propagates within the recess. Accordingly, the effect of the asymmetricity will be reduced significantly even when the bottom has an asymmetric configuration, significantly reducing the detection error.

On the contrary, no electron oscillates in the recess upon oscillation of the electric vector when the direction of the electric vector of the position detection light is orthogonal to the longitudinal direction of the recess (parallel to the iteration direction). The position detection light reaches the bottom of the recess without being attenuated while propagating within the recess. As a result, it is affected by the asymmetricity of the bottom configuration of the recess.

However, when the width of the recess of the alignment mark is not larger than three times of the wavelength and especially when it is narrower than the wavelength, the bottom of the recess of the alignment mark is formed (or considered as being formed) symmetrically. In this event, the polarized light parallel to the iteration direction is not attenuated, so that the intensity of the diffracted light becomes larger than that of the polarized light orthogonal to the iteration direction. This improves the accuracy of detection. In addition, the S/N ratio may further be improved with the iteration direction coincident with the polarization direction depending on the alignment mark, as compared with a case where the polarization direction coincides with the direction along the groove in the recess.

DETAILED DESCRIPTION OF THE PREFERRED EMBODIMENTS

A first embodiment of an alignment apparatus of the present invention is now explained with reference to FIGS. 1, 4 and 5. In the present embodiment, the present invention is applied to an alignment system of a projection type exposure apparatus.

FIG. 4 shows major portions of the projection type exposure apparatus of the present embodiment. In FIG. 4, a reticle 3 is held on a reticle holder 4, 10 and an illumination light IL is irradiated from an illumination optical system (not shown) to a circuit pattern formed on the reticle 3. The circuit pattern is reduced by a factor of five by the projection type optical system 5 and it is transferred to the wafer 1 on which a photo-sensitive material such as resist has been applied. Wafer marks WM which serve as alignment marks are formed in the vicinity of shot areas of the wafer 1 at a predetermined pitch along a measurement direction. The wafer 1 is mounted on a wafer stage 7 through a wafer holder 6. The wafer stage 7 comprises an XY stage for positioning the wafer 1 in a two-dimensional plane normal to an optical axis of the projection type optical system 5, and a Z stage for positioning the wafer 1 along the optical axis.

A movable mirror 8 is arranged on the wafer stage 7. A laser beam of a laser interferometer 9 is reflected by the movable mirror 8 so that the coordinates of the XY stage in the wafer stage 7 are continuously measured. An exposure area of the wafer 1 is positioned by a step-and-repeat system by activating the wafer stage 7 through a drive unit 11.

It is necessary to align the pattern already formed on the wafer 1 to the pattern of the reticle 3 at a precision of less than one fifth of the width of the pattern. For the alignment, a reference mark 10 is attached in the vicinity of the wafer 1 on the wafer stage 7 and an alignment microscope 12 having a light source of the same wavelength as that of the illumination light IL is arranged at the top side of the reticle 3. Numeral 13 denotes an alignment optical system. The position of the wafer mark WM on the wafer 1 is detected by the alignment optical system 13. Detail of the apparatus of FIG. 4 is disclosed in Japanese Laid-Open Patent Application No. 2-272305 (corresponding to U.S. Pat. No. 5,151, 750).

The laser beams LB1 and LB2 are emitted from the alignment optical system 13, and those laser beams are irradiated to the wafer 1 through a deflection mirror 14 and the projection optical system 5. In this case, incident angles of the two laser beams and a pitch of the wafer marks WM are set such that a diffraction light LB0 is generated from the wafer marks WM normally and upwardly to the wafer 1. The diffraction light LB0 is a mixture of a +1-order diffraction light of the laser beam LB1 and a −1-order diffraction light of the laser beam LB2, and the diffraction light LB0 is directed to the alignment optical system 13 through the projection optical system 5 and the deflection mirror 14.

In this case, a relative position of the positions of the two laser beams LB1 and LB2 irradiated to the wafer 1 and the position of the reticle 3 is determined by observing the reference mark 10 provided on the wafer stage 7 over the reticle 3 by using the alignment microscope 12 and detecting the reference mark 10 by the alignment optical system 13.

Figure 5:
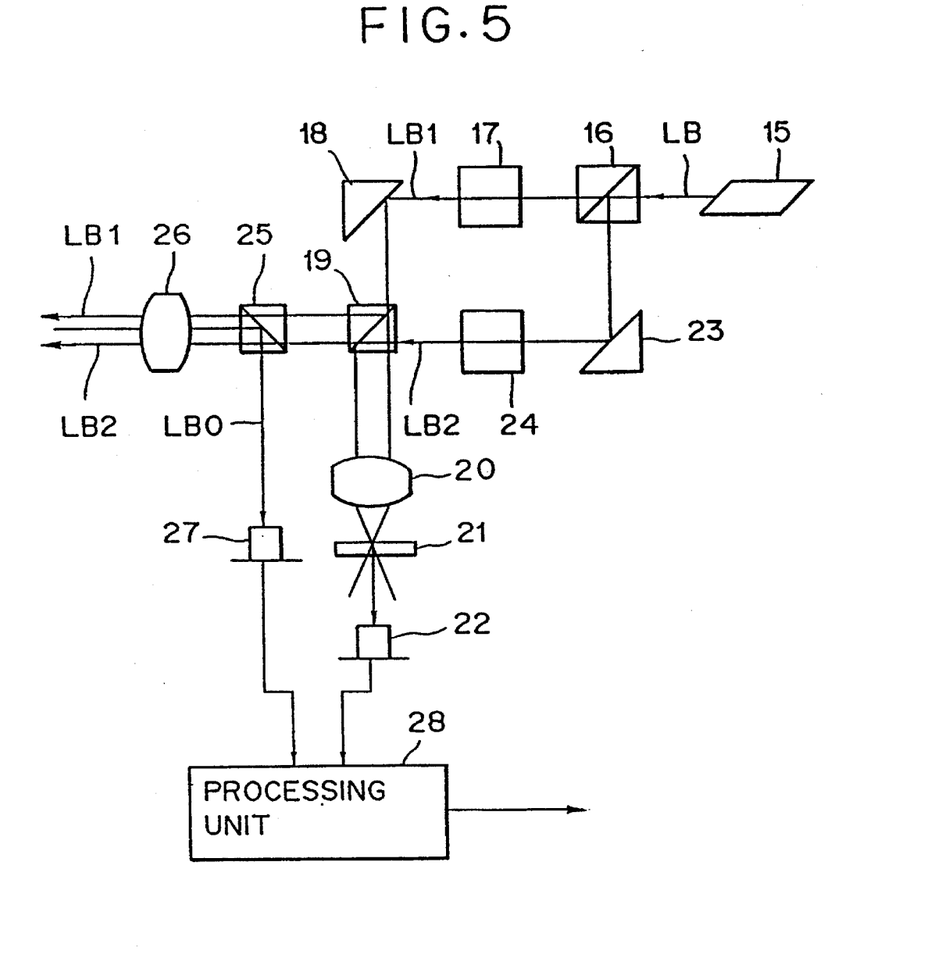
FIG. 5 shows a configuration of an alignment optical system 13 of FIG. 4.

FIG. 5 shows a configuration of the alignment optical system 13. In FIG. 5, the laser beam LB omitted from the laser light source 15 is split into two laser beams LB1 and LB2 by a split prism 16. One laser beam LB1 is directed to a combination prism 19 through a first acousto-optical modulation device (AOM) 17 and a rectangular prism 18, and other laser beam LB2 is directed to the combination prism 19 through a rectangular prism 23 and a second acousto-optical modulation device (AOM) 24. The acousto-optical modulation devices 17 and 24 are driven at different frequencies $f_1$ and $f_2$, and the frequencies of the +1-order diffraction lights of the lights diffracted by the acousto-optical modulation devices 17 and 24 are raised by the respective drive frequencies $f_1$ and $f_2$. The two +1-order diffraction lights of different frequencies (laser beams LB1 and LB2) are directed to the combination prism 19.

The laser beam LB1 transmitted through the combination prism 19 and the laser beam LB2 reflected by the combination prism 19 are focused on a reference grating 21 by an objective lens 20, and two diffraction lights of the lights transmitted through the reference grating 21 which are diffracted normally and downwardly to the reference grating 21 are mixed by a photo-sensing device 22 and detected thereby. On the other hand, the laser beam LB1 reflected by the combination prism 19 and the laser beam LB2 transmitted through the combination prism 19 pass through a split prism 25, are focused by an objective lens 26 and directed to the deflection mirror 14 of FIG. 4.

The diffraction light LB0 from the wafer mark WM of the wafer 1 of FIG. 4 passes through the objective lens 26 of FIG. 5, is reflected by the split prism 25 and directed to the photo-sensing device 27. A reference signal from the photo-sensing device 22 and the alignment signal from the photo-sensing device 27 are supplied to an alignment processing unit 28. The alignment signal produced by photo-electrically converting the diffraction light LB0 by the photo-sensing device 27 is a sine wave having a frequency $\Delta f$ which is a difference between the drive frequencies $f_1$ and $f_2$ of the acousto-optical modulation devices 17 and 24. Similarly, a reference signal produced by the photo-sensing device 22 is a sine wave having a frequency $\Delta f$. A position shift of the wafer 1 can be detected by detecting a phase difference between the reference signal and the alignment signal. The position shift of the wafer detected by the alignment processing unit 28 is sent to a main computer which controls the overall operation of the apparatus.

A detailed construction of the wafer mark WM of the present embodiment is now explained.

FIG. 1 shows an enlarged sectional view of the wafer mark WM of the present embodiment. In FIG. 1, recesses are formed on the surface of the wafer 1 at a pitch P along the X direction which is a measurement direction, and the metal film 2 is deposited on the surface including the recesses. A material of the metal film 2 may be aluminum, gold, copper or chromium. Recesses 2b having width d are formed at the pitch P on the metal film 2 to correspond to the recesses of the wafer 1, and the two laser beams LB1 and LB2 having the wavelength λ are irradiated to the wafer marks. However, since the beams LB1 and LB2 are of different frequencies, the wavelengths thereof are slightly different in a strict sense.

In the present embodiment, the following condition is imparted to the width of the recess 2b of the metal film 2 along the X direction.

$$d < 3\lambda \qquad (1)$$

Where a photo-resist having a refractive index n (approximately 1.7) is applied on the metal film 2 as it is in the present embodiment, the condition for the width d is as follows.

$$d < 3\lambda/n \quad (2)$$

Strictly speaking, the wavelength $\lambda$ in the condition (1) or (2) is the longer one of the wavelengths of the laser beams LB1 and LB2. Accordingly, the width d of the recess 2b of the wafer mark is set to be smaller than three times 3$\lambda$ (or 3$\lambda$/n) of the wavelength $\lambda$ of the laser beams LB1 and LB2 which serve as the alignment detection lights. For example, where He—Ne laser beams are used for the laser beams LB1 and LB2, the wavelength $\lambda$ is 0.633 µm, and the pitch P is 6 µm, for example.

In an experiments, a remarkable effect was attained when the width d of the recess 26 along the X direction meets the following condition for the wavelength $\lambda$ of the laser beams LB1 and LB2 and the refractive index n of the photo-resist.

$$d \leq 2\lambda/n \quad (3)$$

Namely, the detection error in the alignment was particularly small when the width d was smaller than double of the wavelength ($\lambda$/n) after the correction of the refractive index. Specifically, when the refractive index n of the photoresist is 1.7 and the wavelength of the laser beams LB1 and LB2 is 0.633 µm, the upper limit of the width d determined by the condition (3) is 0.75 µm. A particularly excellent result was obtained when the width d was approximately 0.7 µm.

When the wafer marks of FIG. 1 are used, the laser beams LB1 and LB2 exponentially attenuate in the recess 2b so that they do not substantially reach the bottom. Accordingly, even if the wafer marks are asymmetric in the X direction because of the steps $\Delta h1$ created at the bottoms of the recesses 2b, the wafer marks are equivalent to the symmetric wafer marks for the laser beams LB1 and LB2. Thus, the measurement by the laser beams LB1 and LB2 exactly represents the position of the mark and no detection error is involved.

In this case, the larger the step of the recess on the surface of the wafer 1 is, the deeper is the recess 2b of the metal film 2 and the light directed to the recess 2b can be more attenuated. Accordingly, the detection error is more reduced.

Wafer marks in a second embodiment of the present invention are now explained with reference to FIG. 2.

FIG. 2 shows the wafer marks of the present embodiment. In FIG. 2, the metal film 2 is deposited on the wafer 1 by sputtering. In the present embodiment, recesses 29a having a width d1 and projections 29b having the width d1 are arranged at a pitch P1 along the X direction which is the measurement direction of the metal film 2 to form recess groups 30a, 30b, 30c, . . . . Those recess groups 30a, 30b, 30c, . . . are periodically arranged at a pitch P2 along the X direction. The pitch P2 corresponds to the pitch P in FIG. 1. The recess groups 30a, 30b, 30c, . . . are formed following the recesses formed on the wafer 1. The overall width Q1 of the recess groups 30a, 30b, 30c, . . . is given by $$Q1 = (N-1) \cdot P1 + d1 \quad (4)$$

where N is the number of recesses 29a included in each recess group.

In the present embodiment, the width Q1 is set to approximately one half of the pitch P2 of the recess groups 30a, 30b, 30c, . . . . In order to increase the number N of the recesses 29a in each recess group, the pitch P1 is reduced in accordance with the condition (2). In the example of FIG. 2, the pitch P1 is set to approximately double of the width d1 of the recess 29a. The width d1 of the recess 29a along the X direction is imposed the following condition.

$$d1 < 3\lambda \text{ or } d1 < 3\lambda/n \quad (5)$$

where $\lambda$ is the wavelength of the alignment light irradiated to the wafer mark WM of FIG. 2.

Thus, the alignment light directed to the recess 29a is substantially attenuated and does not reach the bottom of the recess 29a. Accordingly, even if the step $\Delta h2$ is created at the bottom of the recess 29a and the wafer mark is asymmetric in the X direction, the wafer mark is equivalent to a symmetric mark for the alignment light. Accordingly, the measurement by the alignment light exactly represents the position of the mark and no detection error is included.

In the present embodiment, the number of recesses 29a is increased while maintaining the periodicity of the pitch P2 to approach an area ratio of the recesses 29a and the projections 29b (including the projected areas between the recess groups) to unity. Accordingly, the intensity of the 1-order diffraction light can be increased and the S/N ratio of the detection signal is enhanced.

Figure 3:
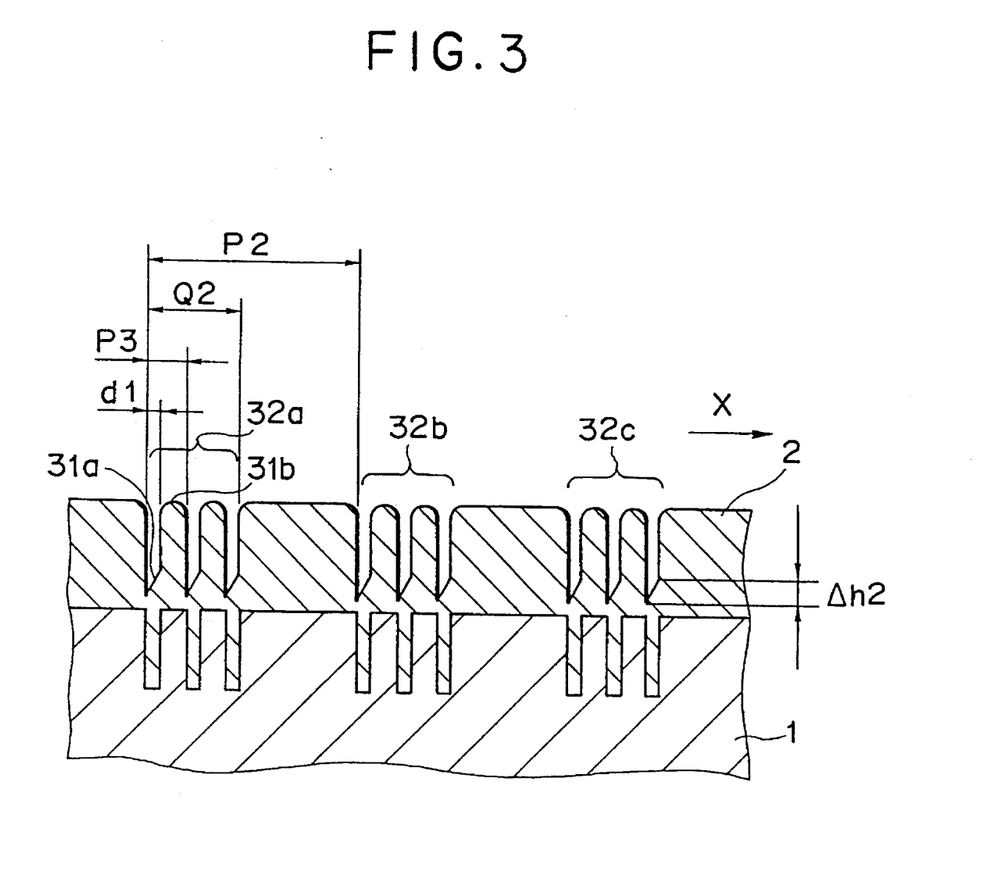
FIG. 3 shows an enlarged sectional view of a modification of a wafer mark of the second embodiment.

Instead of the wafer marks of FIG. 2, wafer marks shown in FIG. 3 may be used. In FIG. 3, recess groups 32a, 32b, 32c, . . . are formed by arranging recesses 31a having the width d1 and projections 31b having the width d1 at a pitch P3 along the X direction which is the measurement direction on the metal film 2 on the wafer 1. Those recess groups 32a, 32b, 32c, . . . are periodically arranged at a pitch P2 along the X direction. The total width of each of the recess groups is Q2 which is set to P2/2. The width d1 of the recess 31a and the pitch P2 of the recess group are identical to those of FIG. 2.

Comparing the example of FIG. 3 with the example of FIG. 2, the pitch P3 in arranging the recesses 31a and the projections 31b in the example of FIG. 3 is larger than the pitch P1 of FIG. 2. Accordingly, the number of recesses 31a in FIG. 3 is smaller than the number of recesses 29a of FIG. 2. As a result, in FIG. 3, the area of the recesses 31a is reduced and the S/N ratio of the detection signal is lowered. However, since the width of the projections 31b in FIG. 3 is wider than the width of the projections 29b in FIG. 2, a risk of break of the wafer marks during the formation of the wafer mark by the break of the projections is reduced.

In the above embodiments, two laser beams are irradiated to the alignment mark to detect the position. Alternatively, one detection beam may be irradiated to the alignment mark to detect the position. In this case, if the diffraction effect is to be utilized, two diffraction lights diffracted from the alignment mark symmetrically to the left and the right may be interfered in the alignment optical system to form an interference fringe.

In the present embodiment, the alignment system adopts the heterodyne system. The present invention is also applicable to a homodyne system or a system in which two light beams having different polarization directions are irradiated to the alignment mark and the diffraction lights from the mark are interfered through an analyzer, to attain the same effect.

The present invention may also applied to not only the system for detecting the phase of the diffraction light from the alignment mark but also to the alignment mark when the position is detected by a so-called laser step alignment system disclosed in Japanese Laid-Open Patent Application No. 60-186845 (corresponding to U.S. Pat. No. 4,699,515), or the alignment mark of an alignment apparatus of an image processing system using an image pickup device, to attain the same effect. For example, in the laser step alignment system, the alignment mark and a slit-shaped probe light are relatively scanned and a change in the intensity of the diffraction light emitted from the alignment mark along a predetermined direction by the probe light is detected to detect the position.

In the alignment marks shown in FIGS. 1, to 3, only the shape along the X direction has been explained and no description has been made for the shape along the non-measurement direction (a direction normal to the X direction). However, the shape in the Y direction may be either linear or the arrangement of a plurality of dot marks at a predetermined pitch along the Y direction, or any other shape. For example, the alignment marks which are linear along the Y direction are one-dimensional grating pattern, and the alignment marks arranged at the predetermined pitch along the Y direction are two-dimentional grating pattern.

With the laser beams LB1 and LB2 irradiated to the wafer mark being circularly polarized, the electric vector (electric field vector) of the laser beam LB1 and LB2 has a polarization component in a direction parallel to the measuring direction for the wafer mark and a polarization component in a direction orthogonal to the measuring direction. In this event, the polarization component orthogonal to the measuring direction for the wafer mark, i.e., the iteration direction (X direction) of the recesses 2b in FIG. 1 is absorbed and attenuated until it reaches the bottom of the recess 2b. On the contrary, the polarization component parallel to the measuring direction reaches the bottom of the recess 2b and is reflected therefrom. Accordingly, with the laser beams LB1 and LB2 irradiated to the wafer mark in the circularly polarized state, a measuring error may be generated due to the asymmetricity of the recess 2b even when the width of the recess 2b in the measuring direction is equal to or around the wavelength of the laser beam.

With this respect, described is an embodiment where the effect of the asymmetricity of the recess 2b of the wafer mark is reduced by means of defining the polarization of the laser beams LB1 and LB2 irradiated to the wafer mark as the linear polarization in the direction determined depending on the iteration direction of the wafer marks.

Figure 9:
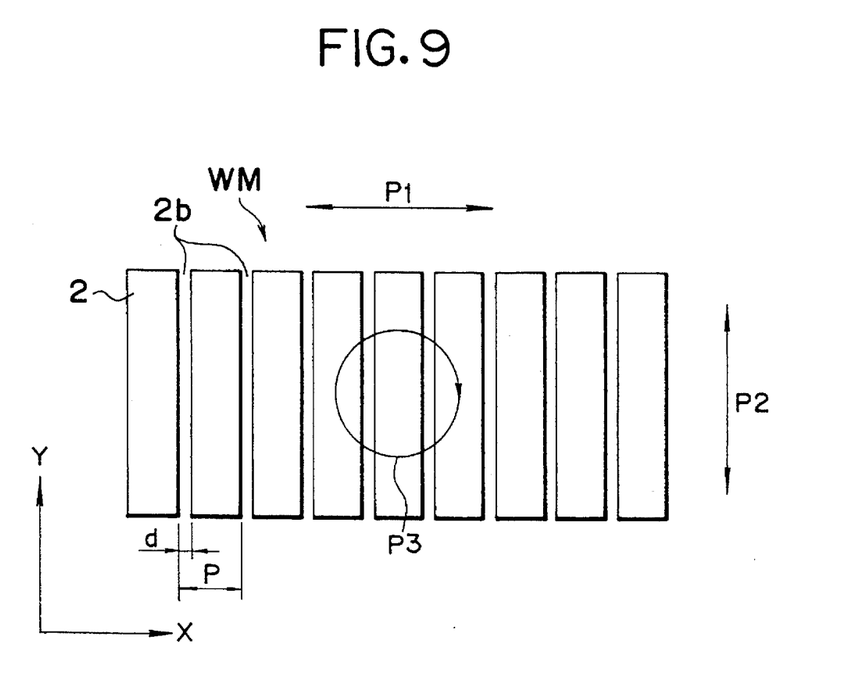
FIG. 9 is an enlarged plan view of a wafer mark according to a first embodiment of the present invention.

FIG. 9 shows a plan view of the wafer mark WM in FIG. 1. As described above, the width d in the X direction of the recess 2b formed on the metal film 2 is not larger than three times of the wavelength λ of the position detection light and especially smaller than the wavelength λ, so that the laser beam is more likely to be attenuated within the recess 2b.

Figure 10:
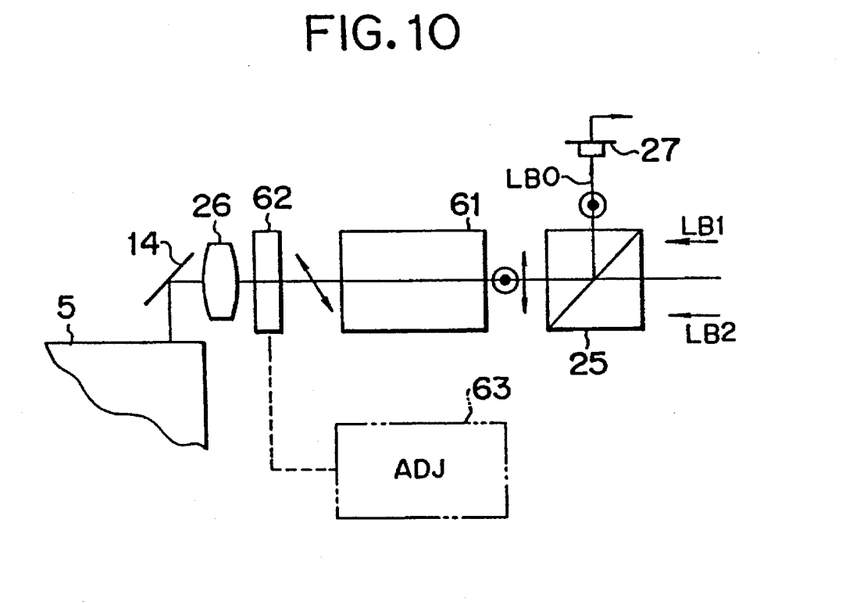
FIG. 10 shows a configuration of a part of an alignment optical system according to an embodiment of the present invention.

The alignment optical system according to the present invention is similar to the alignment optical system illustrated in FIG. 5 except that the split prism 25 is formed of the polarized beam splitter and that two optical elements 61 and 62 are arranged between the polarized beam splitter 25 and the objective lens 26 as shown in FIG. 10. The laser beams LB1 and LB2 directed to the polarized beam splitter 25 are linearly polarized ones, and the polarization direction (the direction of the electric vector) thereof set into the P-polarization (in the direction parallel to the incident plane to the composition plane of the polarized beam splitter 25) relative to the polarized beam splitter 25.

One optical element 61 in FIG. 10 is a Faraday rotator that rotates the polarization direction by 45°. The other optical element 62 is a half wavelength plate 62 adjusted to a predetermined rotation angle. In FIG. 10, the P-polarized laser beams LB1 and LB2 transmitted through the polarized beam splitter 25 are directed to the Faraday rotator 61. The laser beams LB1 and LB2 emitted from the Faraday rotator 61 are linearly polarized beams polarized in the direction rotated at an angle of 45° from the polarization direction. These laser beams LB1 and LB2 further traverse the half wavelength plate 62, by which the polarization direction of the laser beams LB1 and LB2 is rotated an additional +45° or −45°.

The so polarized laser beams are irradiated to the wafer mark WM in FIG. 9 through the objective lens 26, the deflection mirror 14 and the projection optical system 5. In this embodiment, the polarization direction of the laser beams LB1 and LB2 irradiated to the wafer mark WM can be selected from the Y direction orthogonal to the iteration direction of the recesses 2b and the X direction corresponding to the iteration direction by means of adjusting the rotation angle of the half wavelength plate 62.

A diffracted light LB0 diffracted generally vertically upward from the wafer mark WM is, while being linearly polarized, directed to the half wavelength plate 62 in FIG. 10 a second time through the projection optical system 5, the deflection mirror 14 and the objective lens 26. The diffracted light LB0 passing through the half wavelength plate 62 is directed to the Faraday rotator 61 as the linearly polarized beam with the polarization direction rotated 45° as the original. The polarization direction of the diffracted light LB0 traversing the Faraday rotator 61 is rotated an additional 45°. Thus, the polarization direction is rotated 90° until it comes back to the polarized beam splitter 25. Accordingly, the diffracted light LB0 is directed to the polarized beam splitter 25 as the S-polarized laser beam and is totally reflected from the composition plane of the polarized beam splitter 25. The diffracted light LB0 reflected from the polarized beam splitter 25 is directed to the photo-sensing device 27.

The polarization of the laser beam on the wafer mark WM is either the linear polarization parallel to the iteration direction (X direction) of the recesses 2b of the wafer mark WM as indicated by an arrow P1 in FIG. 9 or the linear polarization orthogonal to the iteration direction of the recesses 2b as indicated by an arrow P2. For the purpose of comparison, the polarization of a conventional laser beam irradiated as the circularly polarized beam is indicated by a circle arrow P3 in the figure.

When the wafer mark consists of the recesses 2b formed iteratively in the X direction on the metal film 2, as in the present embodiment, the polarization direction (direction of the electric vector) of the linearly polarized laser beam irradiated to the wafer mark WM is matched to the Y direction orthogonal to the X direction. As a result of this, the electrons at the sides of the recess 2b oscillate in the Y direction as the electric vector oscillates in the Y direction upon transmission of the laser beam through the recess 2b. Accordingly, the laser beam is exponentially attenuated suddenly. The laser beam is thus almost completely attenuated before arriving to the bottom of the recess 2b, so that almost no light will be reflected from the bottom. Consequently, the error on the position detection result for the wafer mark becomes extremely small even when the bottom of the recess 2b is asymmetric in the X direction.

Alternatively, with the wafer mark WM formed of the recesses 2b at a predetermined pitch in the Y direction, the polarization direction of the laser beam irradiated to the wafer mark WM is matched to the X direction orthogonal to the Y direction. As a result of this, the error on the position detection result in the Y direction will be reduced. It is noted that the polarization direction of the laser beam is not necessarily matched with the Y direction orthogonal to the X direction when the wafer mark WM is formed of the recesses iteratively in the X direction on a non-conductive material (such as an insulating material).

In FIG. 10, it is possible to change the polarization direction of the linearly polarized beam rotated 45° by the Faraday rotator 61 into any one of the directions orthogonal, parallel, or other relative to the iteration direction of the recesses 2b of the wafer mark WM by means of disposing the half wavelength plate 62 rotatably around the optical axis, thereby making it possible to adjust the rotation angle by an adjusting device 63 indicated by a phantom line. As an alternative method for changing the polarization direction, a Pockels cell may be used in place of the half wavelength plate 62. The Pockels cell is a cell capable of changing the angle of the linearly polarized laser beam being emitted depending on the magnitude of the applied voltage. Accordingly, it is possible to produce the linearly polarized laser beam polarized in the direction orthogonal or parallel to the iteration direction of the recesses 2b of the wafer mark WM by means of applying to the Pockels cell such a voltage that rotates ±45° the linearly polarized incident light rotated 45°.

Figure 11:
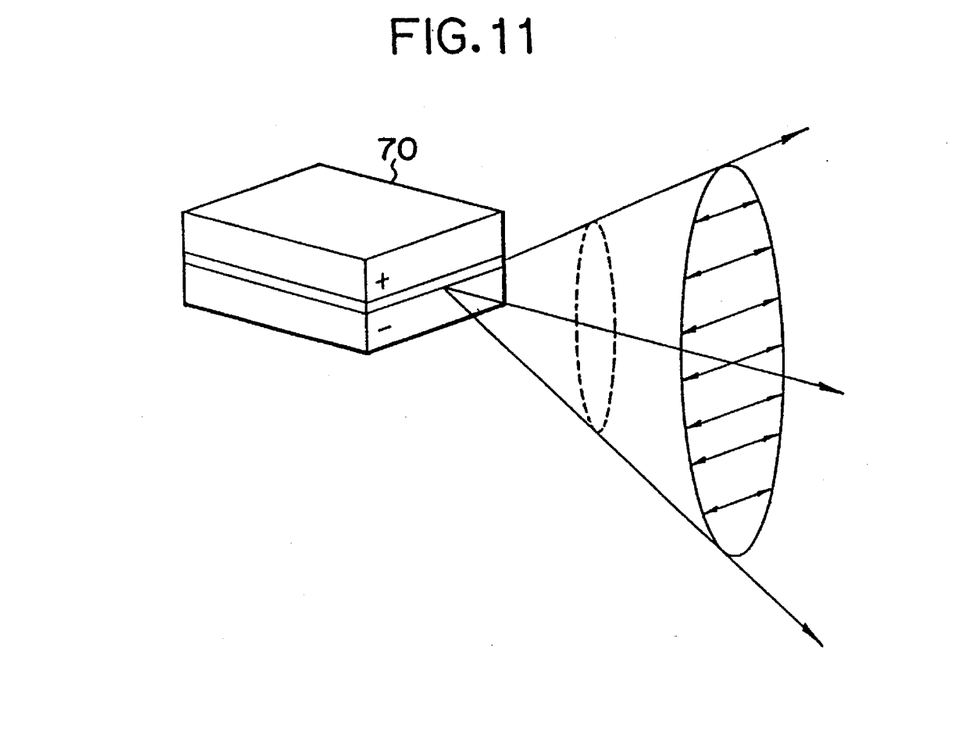
FIG. 11 is a perspective view showing a laser diode.

A laser diode may be used as the laser beam source in the alignment optical system. As shown in FIG. 11, the laser beam emitted from a laser diode 70 spreads more in the direction of the electric field of the laser diode 70 than in the direction along the composition plane. Therefore, the laser beam emitted from the laser diode 70 is oval in sectional configuration. In addition, the laser beam is linearly polarized in the direction shorter in width of the oval shape.

The laser beam irradiated to the wafer mark shown in FIG. 9 is generally parallelogram in the sectional configuration. This sectional configuration is formed by a visual field slit lying at a position conjugate with the wafer. With the laser diode 70 used as the light source, loss of the amount of light can be reduced by means of so adjusting it that the longitudinal direction of the oval cross section of the laser beam emitted from the laser diode 70 coincides with the longitudinal direction of the visual field slit. In addition, the shorter side of the cross section of the laser beam irradiated to the wafer mark WM is typically matched to the Y direction orthogonal to the iteration direction of the recesses 2b, so that the laser diode 70 shown in FIG. 11 is advantageously used to obtain the linearly polarized beam polarized in the Y direction orthogonal to the iteration direction of the recesses 2b of the wafer mark WM.

Next, a modification of this embodiment is described with reference to FIGS. 12 and 13.

Figure 12:
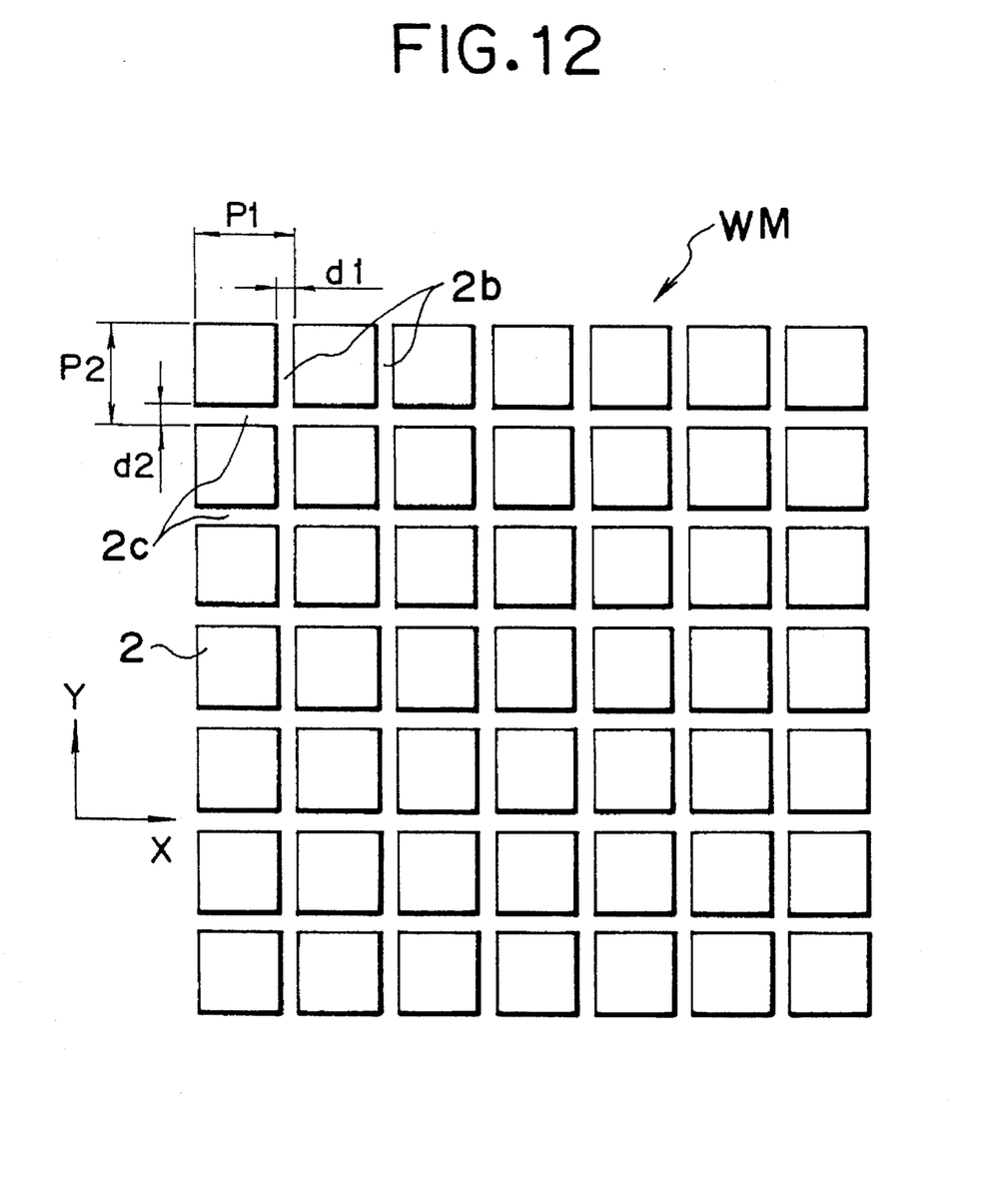
FIG. 12 is an enlarged plan view of a modification of the wafer mark according to the present invention.

FIG. 12 shows a wafer mark in a matrix formed on a wafer. The wafer mark WM comprises the recesses 2b aligned at a pitch P1 in the X direction and recesses 2c aligned at a pitch P2 (typically equal to the pitch P1) in the Y direction formed on the metal film 2 laminated on the wafer. The width of the recess 2b in the X direction is represented by d1 while the width of the recess 2c in the Y direction is represented by d2. The widths d1 and d2 are smaller than three times of the wavelength of the laser beam for the position detection. The wafer mark WM is formed of a two-dimensional diffraction grating consisting of these recesses 2b and 2c. In this embodiment, two laser beams for position measuring in the X direction is mixed with two laser beams for position measuring in the Y direction and irradiated to the wafer mark WM, whereby the wafer mark WM is subjected to the position detection simultaneously in the X and Y directions.

Figure 13:
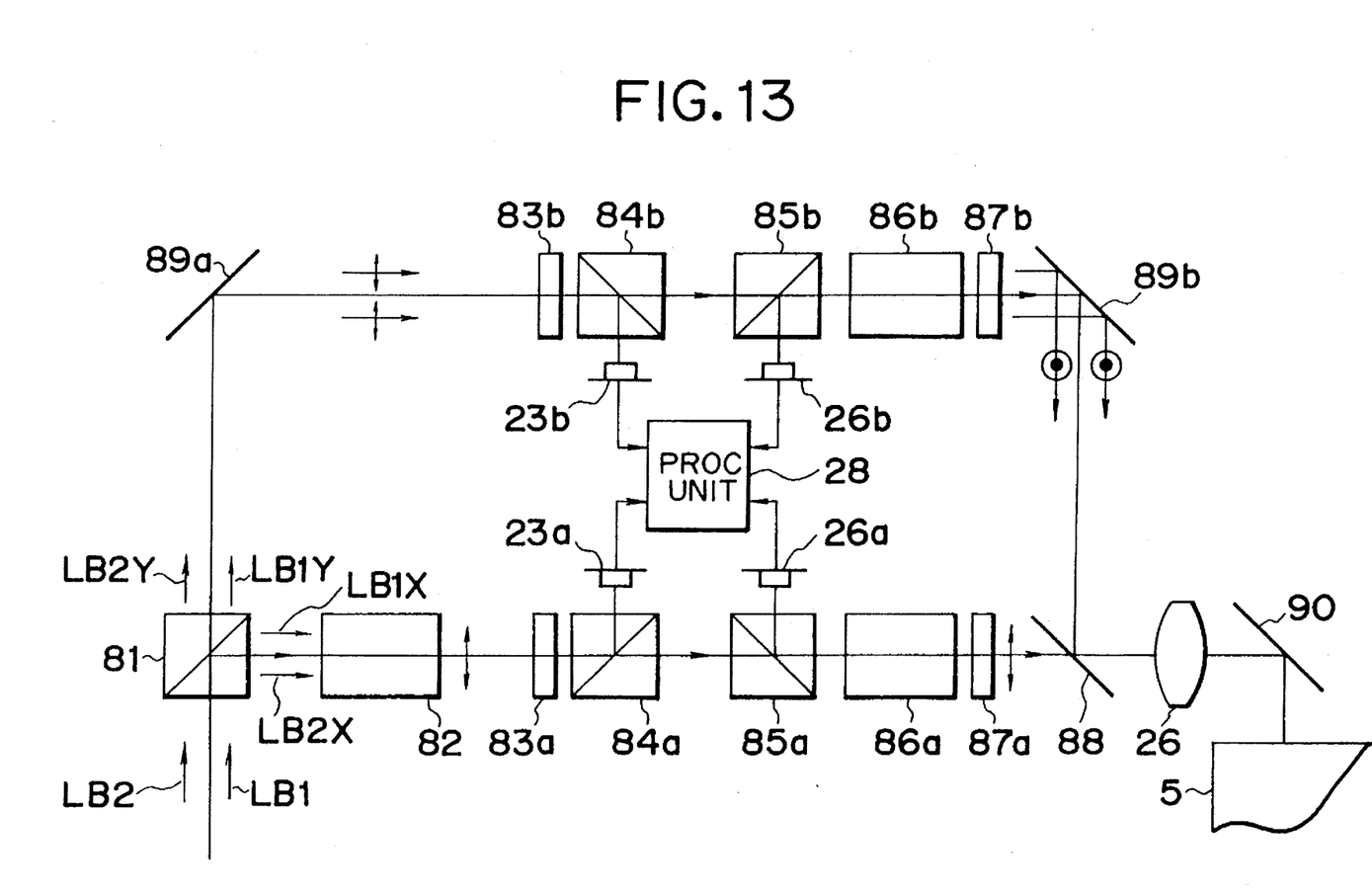
FIG. 13 shows a configuration of major portions of an alignment optical system applicable to the wafer mark shown in FIG. 12.

FIG. 13 shows major portions of the alignment optical system according to this embodiment. Two parallel laser beam LB1 and LB2, emitted from an optical system (such as the combination prism 19 in FIG. 5) which is not shown, are directed to a polarized beam splitter 81 of which the composition plane is orthogonal to the paper surface. The laser beams LB1 and LB2 are linearly polarized in the direction inclined 45° from the direction orthogonal to the paper surface. Of these laser beams, the S-polarized component (the polarized component orthogonal to the paper surface) is reflected from the composition plane of the polarized beam splitter 81, and is picked up as laser beams LB1X and LB2X for use in measuring the position in the X direction. On the other hand, the P-polarized component (the polarized component parallel to the paper surface) of the laser beams is transmitted through the composition plane of the polarized beam splitter 81 and is picked up as laser beams LB1Y and LB2Y for use in measuring the position in the Y direction.

The laser beams LB1Y and LB2Y being circularly polarized are directed to a polarized beam splitter 84b through a mirror 89a and a quarter wavelength plate 83b. The S-polarized component of the laser beams LB1Y and LB2Y is reflected from the polarized beam splitter 84b and is directed to a photo-sensing device 23b through an objective lens and a reference grating, both of which are not shown. On the other hand, the P-polarized component transmits through the polarized beam splitter 84b and then transmits through a polarized beam splitter 85b, following which it traverses through a Faraday rotator 86b and a Pockels cell 87b. The laser beams LB1Y and LB2Y, of which polarization direction is adjusted into the optimum direction by the Faraday rotator 86b and the Pockels cell 87b, are reflected from the mirror 89b and directed to a separation/combination mirror 88 formed of, for example, a polarized beam splitter.

The optical axis of each of the laser beams LB1X and LB2X in the X direction is rotated 90° by a dove prism or an image rotator 82 such that they are irradiated crossed with the direction orthogonal to the Y direction on the wafer mark WM. Subsequently, the laser beams LB1X and LB2X being circularly polarized are directed to a polarized beam splitter 84a through a quarter wavelength plate 83a. The S-polarized component of the laser beams is reflected from the polarized beam splitter 84a and is directed to a photo-sensing device 23a through an objective lens and a reference grating, both of which are not shown. On the other hand, the P-polarized component transmits through the polarized beam splitter 84a and then transmits through a polarized beam splitter 85a, following which it traverses through a Faraday rotator 86a and a Pockels cell 87a. The laser beams LB1X and LB2X, of which polarization direction is adjusted into the optimum direction by the Faraday rotator 86a and the Pockels cell 87a, are directed to the separation/combination mirror 88.

Four laser beams LB1X, LB2X, LB1Y and LB2Y reflected from the separation/combination mirror 88 are irradiated to the wafer mark WM in FIG. 12 through the objective lens 26, a deflection mirror 90 and the projection optical system 5. In this event, the optical axes of the laser beams LB1X and LB2X are orthogonal to the optical axes of the laser beams LB1Y and LB2Y, and thus the polarization directions are orthogonal to each other. Diffracted light beams LB0X and LB0Y are generated, of which polarization directions are orthogonal to each other, from the wafer mark WM due to the laser beams LB1X, LB2X, LB1Y and LB2Y irradiated to the wafer mark WM. These diffracted light beams are directed to the separation/combination mirror 88 through the projection optical system 5, the deflection mirror 90 and the objective lens 26.

The diffracted light beam LB0Y for use in position measurement in the Y direction that is reflected from the separation/combination mirror 88 is radiated to the photo-sensing device 26b through the mirror 89b, the Pockels cell 87b, the Faraday rotator 86b and the polarized beam splitter 85b. Supplied to an alignment processing unit 28 are a reference signal for the Y direction supplied from the photo-sensing device 23b and an alignment signal for the Y direction supplied from the photo-sensing device 26b. In addition, the diffracted light LB0X for the position measurement in the X direction that transmits through the separation/combination mirror 88 is directed to the photo-sensing device 26a through the Pockels cell 87a, the Faraday rotator 86a and the polarized beam splitter 85a. Supplied to the alignment processing unit 28 are a reference signal for the X direction supplied from the photo-sensing device 23a and an alignment signal for the X direction supplied from the photo-sensing device 26a. The alignment processing unit 28 detects the position of the wafer mark WM in the X and Y directions in accordance with two sets of signals received.

In this embodiment, the wafer mark WM in FIG. 12 is formed on the metal film 2. Accordingly, the laser beams LB1X and LB2X in the X direction are irradiated to the wafer mark WM as the linearly polarized beams having the polarization direction of the Y direction. In addition, the laser beams LB1Y and LB2Y in the Y direction are irradiated to the wafer mark WM as the linearly polarized beams having the polarization direction of the X direction. As a result of this, the laser beams are attenuated suddenly within the recesses 2b and 2c of the wafer mark WM and hardly arrive to the bottom. Therefore, the error on the position detection result will be reduced if the bottoms of the recesses 2b and 2c are asymmetrical in the measuring direction.

To simultaneously detect the position in the X and Y directions as in the alignment optical system shown in FIG. 13, the following approaches may be available.

In a first approach, a frequency $\Delta f$ equivalent to a difference between the drive frequencies $f_1$ and $f_2$ for the acousto-optical modulation devices differs between the X and Y directions. The alignment signal indicative of the frequency difference of $\Delta f_x$ for the X direction and the alignment signal indicative of the frequency difference of $\Delta f_y$ for the Y direction are received by a single photo-sensing device. A photoelectric transferring signal supplied from the photo-sensing device is divided into a component of the frequency $\Delta f_x$ and a component of the frequency $\Delta f_y$ through a frequency filtering circuit, which allows simultaneous position measurement in the X and Y directions.

In addition, a second approach divides, into half, the pitch P1 in the X direction and the pitch P2 (normally equal to the pitch P1) in the Y direction of the wafer mark WM in FIG. 12. Half the pitch P1 (P2) of the wafer mark WM doubles the diffraction angle of the laser beam irradiated to the wafer mark WM. As a result, in the incident direction of one laser beam LB1, a 0-order diffracted light of the other laser beam LB2 is emitted overlapped with a +1-order diffracted light of the laser beam LB1. Likewise, in the incident direction of one laser beam LB2, a 0-order diffracted light of the other laser beam LB1 is emitted overlapped with a 1-order diffracted light of the laser beam LB2. This means that no diffracted light is generated normally upward of the wafer mark and it is thus eliminated that the diffracted light for the position detection in the X direction is mixed with the diffracted light for the position detection in the Y direction.

While the above embodiment has thus been described in conjunction with the width of the recess of the alignment mark not larger than three times of the alignment wavelength, the effect of the asymmetric recess is expected to be reduced when the width of the recess exceeds three times of the wavelength as long as the polarization direction of the alignment light (linear polarization) coincides with the direction orthogonal to the iteration direction.

In addition, it may be considered that the bottom of the recess 2b is symmetrically formed when the width d of the recess 2b of the alignment mark (WM) in FIG. 9 is not larger than, for example, three times of the wavelength of the alignment light and especially narrower than the wavelength. In such a case, it is preferable that the polarization direction of the laser beams LB1 and LB2 irradiated to the alignment mark WM coincides with the X direction, the iteration direction. In this event, the light diffracted from the recess 2b allows positive detection of the position because the bottom of the recess 2b is symmetrical. Accordingly, as compared with a case where the polarized direction coincides with the Y direction orthogonal to the iteration direction, the intensity of the diffracted light is increased as the diffracted light is not attenuated in the recess 2b. In other words, it is advantageous in that the S/N ratio will be improved.

Further, it may be so arranged that the polarization direction of the alignment light can be changed adequately depending on the width of the recess of the alignment mark and/or the degree of asymmetricity of the bottom thereof. More specifically, it may be provided with (by means of, for example, setting in a control unit for generally controlling the whole apparatus) a first mode for coinciding the polarization direction with the direction orthogonal to the iteration direction and a second mode for coinciding the polarization direction with the iteration direction. One of the first and second modes is selected depending on the width of the recess of the alignment mark and/or the degree of asymmetricity of the bottom thereof. The polarization direction is adjusted (or confirmed) according to the selected mode before detecting the mark. For example, the first mode is selected when the width of the recess of the alignment mark on the wafer exceeds the alignment wavelength. The second mode is selected when the width of the recess is narrower than the wavelength. In this event, it is preferable that the polarization direction is coincident with the direction orthogonal to the iteration direction even when the width of the recess is narrower than the wavelength if the asymmetricity is present in the bottom thereof.

An operator may select the mode depending on mark information (the width of the recess, whether the bottom is asymmetric) and set it to the apparatus through a keyboard. Alternatively, the apparatus itself may select the mode automatically according to information (the width of the recess, whether the bottom is asymmetric, a name of the wafer or the like) indicated on the wafer or a bar code of a wafer cassette. The alignment mark may be detected by using an alignment sensor implementing an image processing system as those disclosed in, for example, U.S. Pat. No. 4,962,318. The mode may be selected depending on the asymmetricity of the recess and the width of the recess obtained according to the detection results. The alignment sensor disclosed in the above mentioned publication irradiates to the alignment mark an illumination light (such as a white light) having predetermined wavelengths. An image of the mark in question is focused on an index plate disposed within a plane conjugated with the wafer. In addition, the image of the alignment mark and an image of an index mark on the index plate are focused on a photosensitive surface of an image pick-up cell, thereby detecting a relative position displacement between these marks.

While the above mentioned embodiment has thus been described in conjunction with the alignment sensor implementing the two-beam interference system, the present invention may equally be applied to the alignment sensor implementing the above mentioned image processing system to obtain effects equivalent to those provided in the above mentioned embodiment.

What is claimed is:

1. An alignment apparatus comprising:
   an alignment mark including projections and recesses formed on an article under test along an alignment direction;
   an illumination optical system for irradiating a position detection light to said alignment mark;
   a width of the recess of said alignment mark along the alignment direction being selected to be smaller than three times of a wavelength of the position detection light; and
   a detection optical system for detecting a light produced from said alignment mark by the irradiation of the light.

2. An alignment apparatus according to claim 1 wherein said alignment mark includes a plurality of patterns each having projections and recesses arranged at a first pitch along said alignment direction, and said patterns are arranged at a second pitch larger than the first pitch along said alignment direction.

3. An alignment apparatus according to claim 1 wherein said article under test includes a metal film deposited on the surface thereof, and said alignment mark is formed on said metal film.

4. An alignment apparatus comprising:
   an alignment mark having projections and recesses arranged iteratively on an article along an alignment direction;
   an illumination optical system for irradiating linearly polarized light for position detection to said alignment mark;
   a width of the recess of said alignment mark along the alignment direction being selected to be smaller than three times of a wavelength of said light for position detection; and
   a photosensitive optical system for sensing the light produced from said alignment mark by the irradiation of the light.

5. An alignment apparatus according to claim 4, wherein said linearly polarized light for position detection is so controlled that a direction of the linear polarization on said alignment mark coincides with a predetermined direction determined depending on an iteration direction of said alignment mark.

6. An alignment apparatus according to claim 5, wherein said linearly polarized light for position detection is so controlled that a direction of an electric vector on said alignment mark is orthogonal to the iteration direction of said alignment mark.

7. An alignment apparatus according to claim 5, wherein said linearly polarized light for position detection is so controlled that a direction of an electric vector on said alignment mark is coincident with the iteration direction of said alignment mark.

8. An alignment apparatus according to claim 4, wherein said illumination optical system comprises an adjusting device for use in changing the directions of the linear polarization on said alignment mark.

9. An alignment apparatus comprising:
   an alignment mark having projections and recesses arranged iteratively on an article along an alignment direction;
   an illumination optical system for irradiating linearly polarized light for position detection to said alignment mark, said linearly polarized light for position detection being so controlled that a direction of an electric vector on said alignment mark is orthogonal to said alignment direction; and
   a photosensitive optical system for sensing light produced from said alignment mark by the irradiation of the light.

10. An alignment apparatus comprising:
    an alignment mark having projections and recesses arranged iteratively on an article along an alignment direction;
    an illumination optical system for irradiating linearly polarized light for position detection to said alignment mark, said linearly polarized light for position detection being so controlled that a direction of an electric vector on said alignment mark is coincident with said alignment direction; and
    a photosensitive optical system for sensing light produced from said alignment mark by the irradiation of the light.

11. An alignment apparatus comprising:
    an alignment mark having projections and recesses arranged iteratively on an article along an alignment direction;
    an illumination optical system for irradiating linearly polarized light for position detection to said alignment mark, said linearly polarized light for position detection being so controlled that a direction of an electric vector on said alignment mark is orthogonal to said alignment direction; and
    said illumination optical system including an adjusting device for changing direction of the linear polarization on said alignment mark between a first direction in which an electric vector on said alignment mark is orthogonal to said alignment direction and a second direction in which the electric vector on said alignment mark is coincident with said alignment direction; and
    a photosensitive optical system for sensing light produced from said alignment mark by the irradiation of the light.

* * * * *